United States Patent
Potvin

(10) Patent No.: US 8,499,265 B2
(45) Date of Patent: Jul. 30, 2013

(54) CIRCUIT FOR DETECTING AND PREVENTING SETUP FAILS AND THE METHOD THEREOF

(75) Inventor: Stephen Potvin, Winooski, VT (US)

(73) Assignee: Nanya Technology Corporation, Kueishan (TW)

( * ) Notice: Subject to any disclaimer, the term of this patent is extended or adjusted under 35 U.S.C. 154(b) by 141 days.

(21) Appl. No.: 13/026,653

(22) Filed: Feb. 14, 2011

(65) Prior Publication Data

US 2012/0206166 A1 Aug. 16, 2012

(51) Int. Cl.
*G06F 9/455* (2006.01)
*G06F 17/50* (2006.01)

(52) U.S. Cl.
USPC ........... 716/108; 716/106; 716/110; 716/111; 716/113; 327/90; 327/94

(58) Field of Classification Search
USPC ............ 716/106, 107, 108, 110–114; 327/90, 327/94
See application file for complete search history.

(56) References Cited

U.S. PATENT DOCUMENTS

| 7,622,961 | B2 * | 11/2009 | Grochowski et al. | 327/20 |
| 2008/0071489 | A1 * | 3/2008 | Wissel | 702/79 |
| 2008/0129357 | A1 * | 6/2008 | Chlipala et al. | 327/161 |
| 2009/0037860 | A1 * | 2/2009 | Kanno | 716/6 |
| 2009/0296503 | A1 * | 12/2009 | Chu et al. | 365/193 |
| 2010/0052730 | A1 * | 3/2010 | Grochowski et al. | 327/20 |
| 2010/0153895 | A1 * | 6/2010 | Tetelbaum et al. | 716/6 |
| 2010/0153896 | A1 * | 6/2010 | Sewall et al. | 716/6 |
| 2011/0267096 | A1 * | 11/2011 | Chlipala et al. | 326/16 |
| 2011/0302460 | A1 * | 12/2011 | Idgunji et al. | 714/55 |
| 2012/0068749 | A1 * | 3/2012 | Sood et al. | 327/202 |

* cited by examiner

*Primary Examiner* — Nha Nguyen
(74) *Attorney, Agent, or Firm* — Novak Druce Connolly Bove + Quigg LLP

(57) ABSTRACT

A circuit for preventing a setup fail between a first latch and a second latch according to one embodiment of the present invention comprises a mimic combinational logic module and a clock compare module. The mimic combinational logic module is configured to receive a first clock signal for the first latch and to generate a delayed first clock signal, which is a delayed version of the first clock signal. The clock compare module is configured to provide a delayed second clock signal, which is a delayed version of a second clock signal for the second latch, to the second latch after receiving the delayed first clock signal and the second clock signal.

17 Claims, 7 Drawing Sheets

CIRCUIT FOR DETECTING AND PREVENTING SETUP FAILS AND THE METHOD THEREOF

BACKGROUND OF THE INVENTION

1. Field of the Invention

The present invention relates to a circuit design, and more particularly, to a circuit design for detecting and preventing setup fails.

2. Description of the Related Art

In circuit design, it is not uncommon for the chip to fail during the test stage. Therefore, debugging, i.e. locating the problem that causes the chip to fail, is extremely important, and may even comprise a majority of the time to produce the product. Setup fail is one of the most troublesome and significant issues related to chip production.

FIG. 1 shows a conventional circuit block. As shown in FIG. 1, the circuit block 100 comprises a first latch 102 and a second latch 104. The first latch 102 receives a data signal A and a clock signal CLK1, and outputs a data signal B. The second latch 104 receives the data signal B, which passes through a combinational logic 150, and a clock signal CLK2, and outputs a data signal Y. Normally, the data signal B arrives at the second latch 104 before the clock signal CLK2. Therefore, the data signal B is correctly latched, and is outputted as the data signal Y. However, if the data signal B arrives at the second latch 104 after the clock signal CLK2, the data signal B cannot be correctly latched by the second latch 104, and a setup fail occurs.

Debugging setup fails on chips can be very costly and time consuming, especially if there are no probe pads available when they are needed in the debugging process. Therefore, there is a need to design a circuit and method to detect and prevent setup fails.

SUMMARY OF THE INVENTION

The circuit for preventing a setup fail between a first latch and a second latch according to one embodiment of the present invention comprises a mimic combinational logic module and a clock compare module. The mimic combinational logic module is configured to receive a first clock signal for the first latch and to generate a delayed first clock signal, which is a delayed version of the first clock signal. The clock compare module is configured to provide a delayed second clock signal, which is a delayed version of a second clock signal for the second latch, to the second latch after receiving the delayed first clock signal and the second clock signal.

The circuit for detecting a setup fail between a first latch and a second latch according to another embodiment of the present invention comprises a mimic combinational logic module and a clock compare module. The mimic combinational logic module is configured to receive a first clock signal for the first latch and to generate a delayed first clock signal, which is a delayed version of the first clock signal. The clock compare module is configured to receive the delayed first clock signal and a second clock signal for the second latch and to provide an error signal if the delayed first clock signal is received after the second clock signal.

The method for preventing a setup fail between a first latch and a second latch according to one embodiment of the present invention comprises the steps of: delaying a first clock signal for the first latch to generate a delayed first clock signal, which is a delayed version of the first clock signal; and providing a delayed second clock signal, which is a delayed version of a second clock signal for the second latch, to the second latch after receiving both the delayed first clock signal and the second clock signal.

The method for detecting a setup fail between a first latch and a second latch according to another embodiment of the present invention comprises the steps of: delaying a first clock signal for the first latch to generate a delayed first clock signal, which is a delayed version of the first clock signal; receiving the delayed first clock signal and a second clock signal, for the second latch; and activating an error signal if the delayed first clock signal is received after the second clock signal.

The foregoing has outlined rather broadly the features and technical advantages of the present invention in order that the detailed description of the invention that follows may be better understood. Additional features and advantages of the invention will be described hereinafter, and form the to subject of the claims of the invention. It should be appreciated by those skilled in the art that the conception and specific embodiment disclosed may be readily utilized as a basis for modifying or designing other structures or processes for carrying out the same purposes as those of the present invention. It should also be realized by those skilled in the art that such equivalent constructions do not depart from the spirit and scope of the invention as set forth in the appended claims.

BRIEF DESCRIPTION OF THE DRAWINGS

The objectives and advantages of the present invention will become apparent upon reading the following description and upon referring to the accompanying drawings of which.

DETAILED DESCRIPTION OF THE INVENTION

Figure 1:
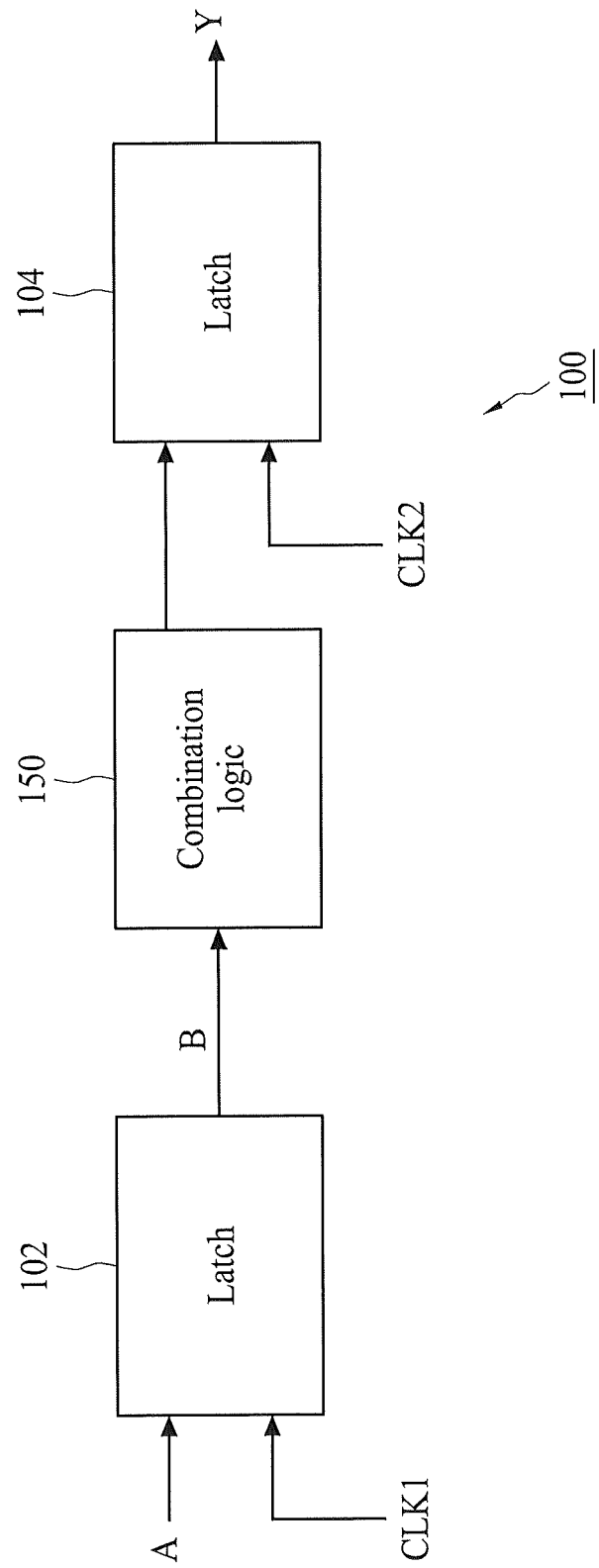
FIG. 1 shows a conventional circuit block.
Figure 2:
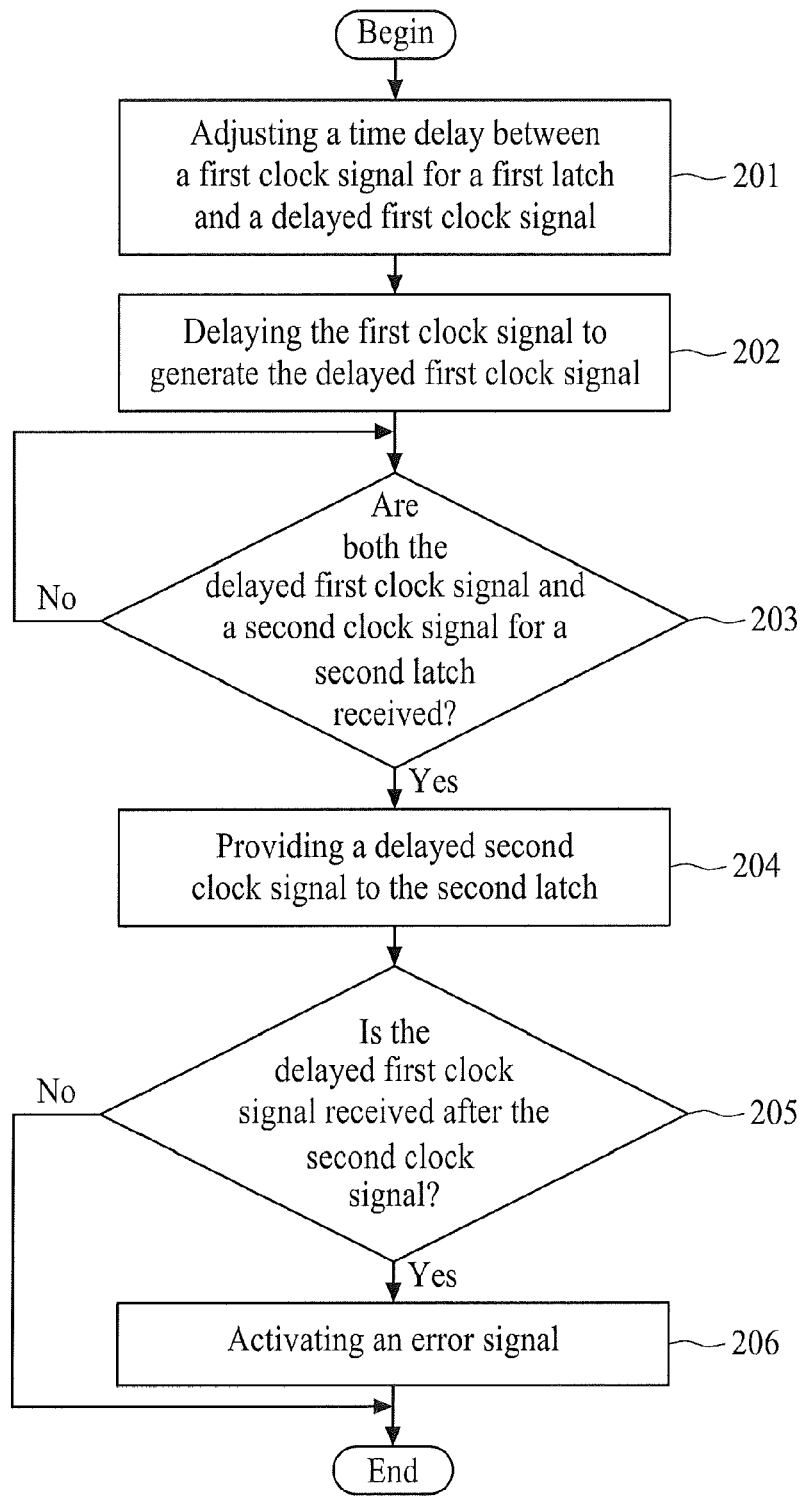
FIG. 2 shows a flowchart of the method for detecting and preventing a setup fail between a first latch and a second latch according to an embodiment of the present invention.

FIG. 2 shows a flowchart of the method for detecting and preventing a setup fail between a first latch and a second latch according to an embodiment of the present invention. In step 201, a time delay between a first clock signal for a first latch and a delayed first clock signal, which is a delayed version of the first clock signal, is adjusted, and step 202 is executed. In step 202, the first clock signal is delayed to generate the delayed first clock signal, and step 203 is executed. In step 203, whether the delayed first clock signal and a second clock signal for a second latch are both received is determined. If both the delayed first clock signal and a second clock signal for a second latch are received, step 204 is executed; otherwise, step 203 is executed. In step 204, a delayed second clock signal, which is a delayed version of the second clock signal, is provided to the second latch, and step 205 is executed. In step 205, whether the delayed first clock signal is received after the second clock signal is determined. If the delayed first clock signal is received after the second clock signal, step 206 is executed; otherwise, the present method is finished. In step 206, an error signal is activated, and the present method is finished.

Preferably, a time delay between the first clock signal and the delayed first clock signal is within a specific range of a time delay of a signal path between the first latch and the second latch. For example, the time delay between the first clock signal and the delayed first clock signal can be adjusted to match the time delay of the signal path between the first latch and the second latch.

Figure 3:
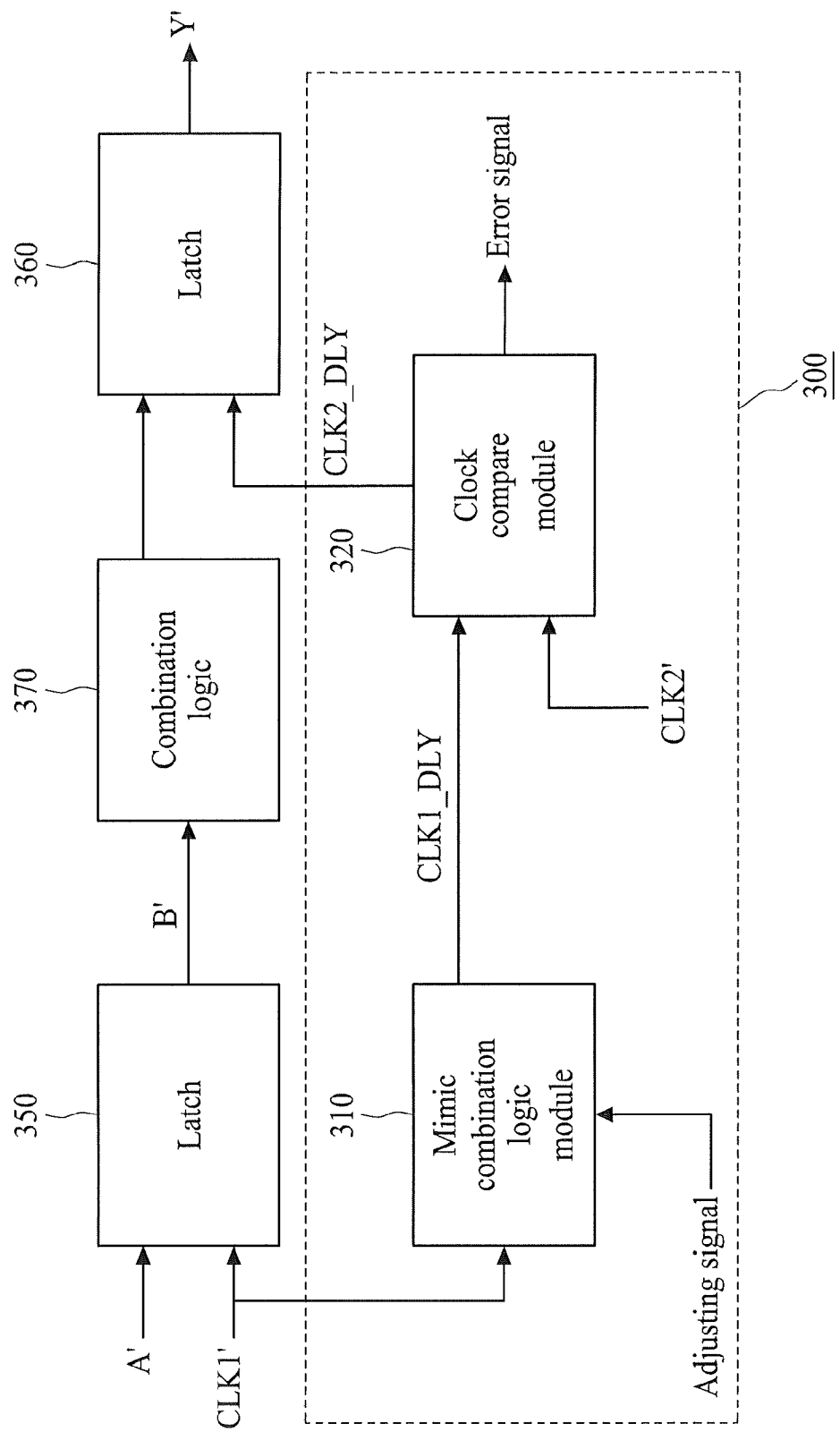
FIG. 3 shows the block diagram of a circuit for detecting and preventing a setup fail between a first latch and a second latch according to an embodiment of the present invention.

FIG. 3 shows the block diagram of a circuit for detecting and preventing a setup fail between a first latch and a second latch according to an embodiment of the present invention. The circuit 300 shown in FIG. 3 can be used to implement the method shown in FIG. 2. As shown in FIG. 3, the circuit 300 is connected between a latch 350 and a latch 360. The latch 350 receives a data signal A' and a clock signal CLK1', and outputs a data signal B'. The latch 360 receives the data signal B', which passes through a combinational logic 370, and a clock signal CLK2_DLY', and outputs a data signal Y'. The circuit 300 comprises a mimic combinational logic module 310 and a clock compare module 320. The mimic combinational logic module 310 is configured to receive the clock signal CLK1' and to generate a delayed version of the clock signal CLK1', a clock signal CLK1_DLY. The clock compare module 320 is configured to provide a delayed version of the clock signal CLK2', a clock signal CLK2_DLY, to the latch 360.

Preferably, the time delay provided by the mimic combinational logic module 310 is adjustable for the purpose of determining how close to fail the latch is, which in turn can potentially identify marginalities. Accordingly, a time delay between the clock signal CLK1' and the clock signal CLK1_DLY is within a specific range of a time delay of a time delay induced by the combinational logic 370. For example, the time delay between the clock signal CLK1' and the clock signal CLK1_DLY can be adjusted to match the time delay induced by the combinational logic 370.

As shown in FIG. 3, the data signal A' is latched by the latch 350 with the clock signal CLK1'. The output signal B' of the latch 350 travels through the combinational logic 370 before arriving at the latch 360. In parallel, the clock signal CLK1' travels through the mimic combinational logic module 310 with tunable options and becomes the clock signal CLK1_DLY before arriving at the clock compare module 320. When the clock signal CLK2' arrives at the clock compare module 320, the clock signal CLK2' can only be passed, as the clock signal CLK2_DLY, to the latch 360 if the clock signal CLK1_DLY has arrived. If clock signal CLK1_DLY has not arrived at the time the clock signal CLK2' arrives, the data signal B' will not be latched into the latch 360 until the clock signal CLK1_DLY arrives at the clock compare module 320, and an error signal will be generated at the clock compare module 320 signifying that a fail has taken place. In some embodiments of the present invention, the clock signal CLK1' and the clock signal CLK2' are not derived from the same source, and are independently generated with no relation to each other.

Figure 4:
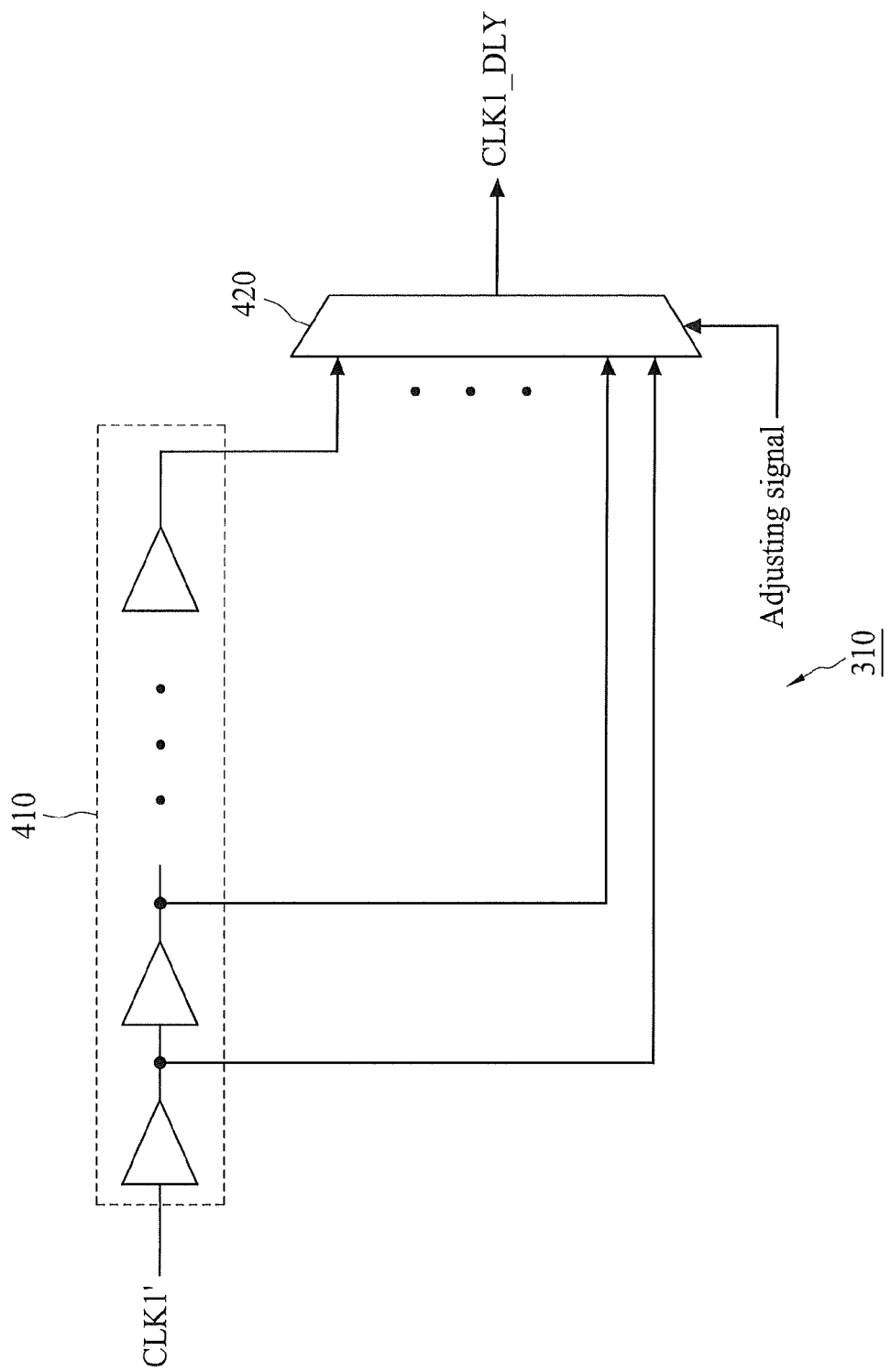
FIG. 4 shows the block diagram of a mimic combinational logic module according to an embodiment of the present invention.

FIG. 4 shows the block diagram of the mimic combinational logic module 310 according to an embodiment of the present invention. As shown in FIG. 4, the mimic combinational logic module 310 comprises a delay chain 410 and a multiplexer 420. The delay chain 410 is configured to provide different delay versions of the clock signal CLK1'. The multiplexer 420 is configured to select one of the delay versions of the first clock signal as the clock signal CLK1_DLY according to an adjusting signal.

Figure 5:
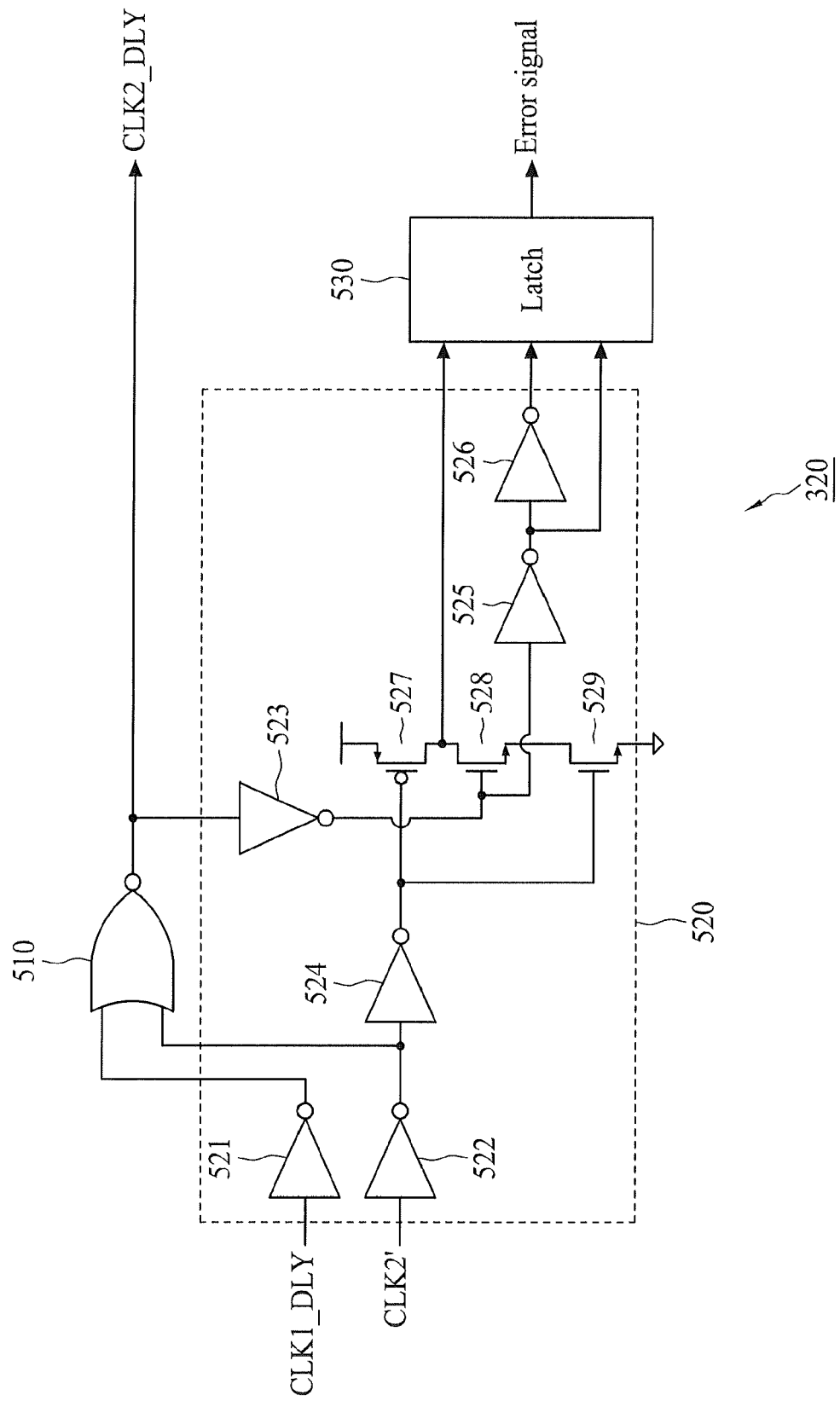
FIG. 5 shows the block diagram of a clock compare module according to an embodiment of the present invention.

FIG. 5 shows the block diagram of the clock compare module 320 according to an embodiment of the present invention. As shown in FIG. 5, the clock compare module 320 comprises a gate logic 510, a combinational logic block 520 and a third latch 530. The gate logic 510 is configured to receive the clock signal CLK1_DLY and the clock signal CLK2' and to provide the clock signal CLK2_DLY, wherein the logic level of the clock signal CLK2_DLY is high when both the logic levels of the clock signal CLK1_DLY and the clock signal CLK2' are high, and the logic level of the clock signal CLK2_DLY is low otherwise. The combinational logic block 520 comprises inverters 521 to 526 and transistors 527 to 529, and is configured to receive the clock signal CLK2' and the clock signal CLK2_DLY and to provide a combinational data signal and a combinational clock signal. The third latch 530 is configured to receive the combinational data signal and the combinational clock signal from the combinational logic block 520 respectively as its data input and clock signal, and to provide its data output as the error signal.

Figure 6:
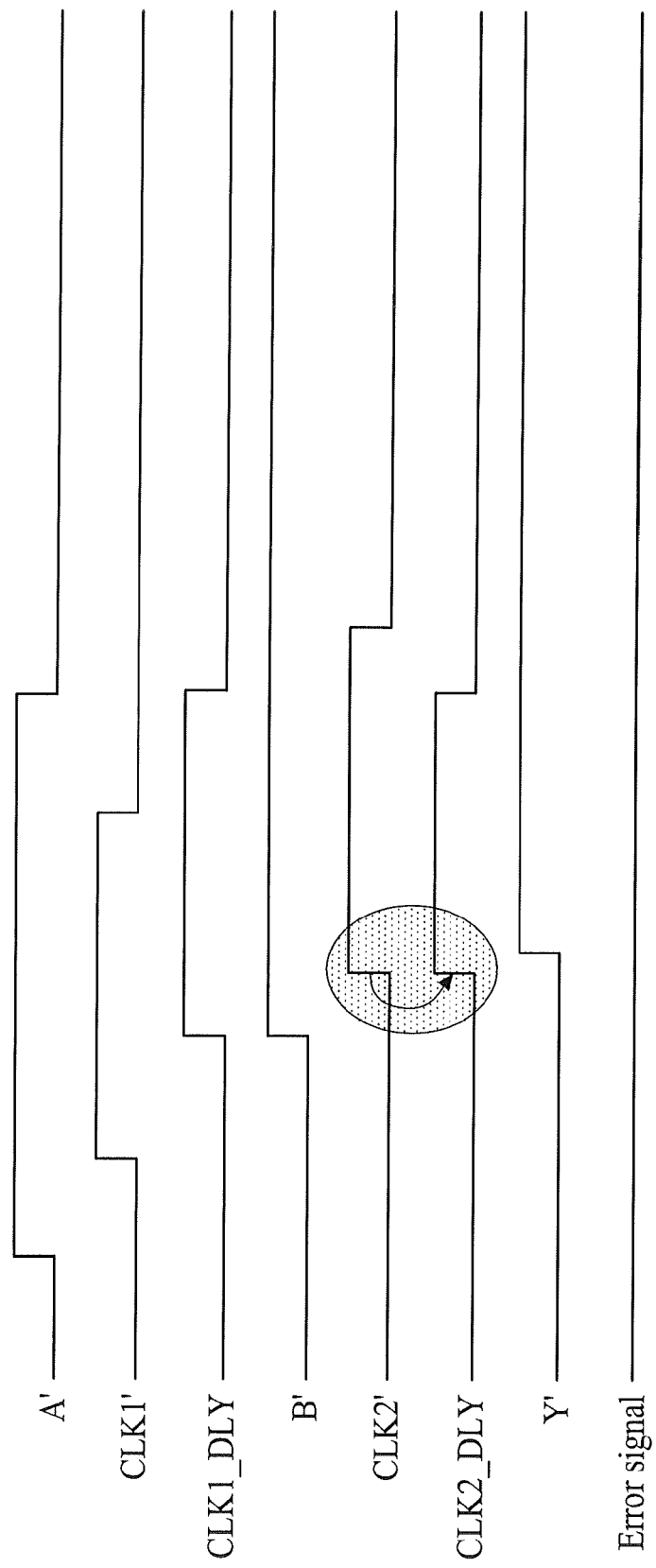
FIG. 6 shows a waveform of different signal lines when applying the method and circuit for detecting and preventing a setup fail between a first latch and a second latch provided by an embodiment of the present invention.

FIG. 6 shows a waveform of different signal lines of the circuit 300 according to an embodiment of the present invention. Normally, the clock signal CLK1_DLY arrives at the clock compare module 320 before the clock signal CLK2'. As shown in FIG. 6, the clock signal CLK1_DLY goes to high before the clock signal CLK2'. Therefore, the clock signal CLK2_DLY is activated by the clock signal CLK2', as indicated by the circle shown in FIG. 6. Accordingly, the setup fail does not occur, and the error signal is kept deactivated.

Figure 7:
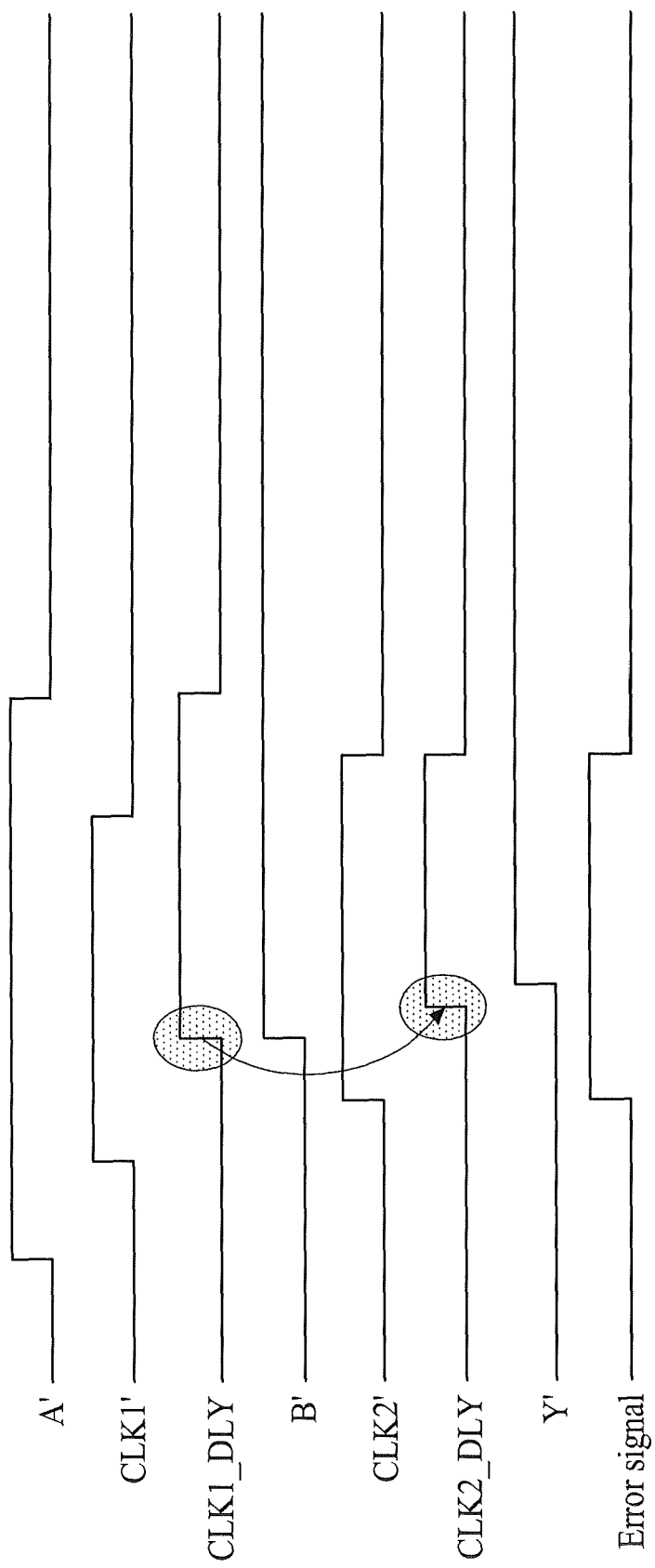
FIG. 7 shows another waveform of different signal lines when applying the method and circuit for detecting and preventing a setup fail between a first latch and a second latch provided by an embodiment of the present invention.

FIG. 7 shows a waveform of different signal lines of the circuit 300 according to another embodiment of the present invention. In this embodiment, the clock signal CLK1_DLY arrives at the clock compare module 320 after the clock signal CLK2'. As shown in FIG. 7, the clock signal CLK1_DLY goes to high after the clock signal CLK2'. Therefore, the clock signal CLK2_DLY is activated by the clock signal CLK1_DLY, as indicated by the circle shown in FIG. 6. Accordingly, a setup fail occurs, and the error signal is activated.

In conclusion, the method and circuit for detecting and preventing setup fails according to embodiments of the present invention detect whether a setup fail occurs at a latch when multiple latches are used in series for any subsequent latch after the first. If a setup violation occurs as detected by comparing the original latching clock to the subsequent latching clock, the subsequent latching clock will not be allowed to latch data into the subsequent latch until the original latching clock arrives. If a setup violation occurs, the fail can be reported.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A circuit for preventing a setup fail between a first latch and a second latch, comprising:
   a mimic combinational logic module, configured to receive a first clock signal for the first latch and to generate a delayed first clock signal, wherein a time delay between the first clock signal and the delayed first clock signal matches the time delay of the signal path between the first latch and the second latch through a combination logic; and
   a clock compare module, configured to pass a second clock signal to the second latch when the delayed first clock signal has arrived; and
   wherein the clock compare module is configured to provide an error signal if the delayed first clock signal is received after the second clock signal.

2. The circuit of claim 1, wherein the clock compare module comprises:
   a gate logic, configured to receive the delayed first clock signal and the second clock signal and to provide the delayed second clock signal, wherein the logic level of the delayed second clock signal is high when both the logic levels of the delayed first clock signal and the second clock signal are high, and the logic level of the delayed second clock signal is low otherwise;
   a combinational logic block, configured to receive the second clock signal and the delayed second clock signal and to provide a combinational data signal and a combinational clock signal; and
   a third latch, configured to receive the combinational data signal as its data input, receive the combinational data signal as its clock signal, and provide its data output as the error signal.

3. The circuit of claim 1, wherein a time delay between the first clock signal and the delayed first clock signal is within a specific range of a time delay of a signal path between the first latch and the second latch.

4. The circuit of claim 3, wherein the time delay between the first clock signal and the delayed first clock signal matches the time delay of the signal path between the first latch and the second latch.

5. The circuit of claim 4, wherein the mimic combinational logic module comprises:
   a delay chain, configured to provide different delay versions of the first clock signal; and
   a multiplexer, configured to select one of the delay versions of the first clock signal as the delayed first clock signal according to the adjusting signal.

6. The circuit of claim 3, wherein the time delay between the first clock signal and the delayed first clock signal is adjustable according to an adjusting signal.

7. A circuit for detecting a setup fail between a first latch and a second latch, comprising:
   a mimic combinational logic module, configured to receive a first clock signal for the first latch and to generate a delayed first clock signal, wherein a time delay between the first clock signal and the delayed first clock signal matches the time delay of the signal path between the first latch and the second latch through a combination logic; and
   a clock compare module, configured to receive the delayed first clock signal and a second clock signal for the second latch, and to generate an error signal when the delayed first clock signal arrives later than the second clock signal.

8. The circuit of claim 7, wherein the clock compare module comprises:
   a gate logic, configured to receive the delayed first clock signal and the second clock signal and to provide a delayed second clock signal, which is a delayed version of a second clock signal for the second latch, wherein the logic level of the delayed second clock signal is high when both the logic levels of the delayed first clock signal and the second clock signal are high, and the logic level of the delayed second clock signal is low otherwise;
   a combinational logic block, configured to receive the second clock signal and the delayed second clock signal and to provide a combinational data signal and a combinational clock signal; and
   a third latch, configured to receive the combinational data signal as its data input, receive the combinational data signal as its clock signal, and provide its data output as the error signal.

9. The circuit of claim 7, wherein a time delay between the first clock signal and the delayed first clock signal is within a specific range of a time delay of a signal path between the first latch and the second latch.

10. The circuit of claim 9, wherein the time delay between the first clock signal and the delayed first clock signal matches the time delay of the signal path between the first latch and the second latch.

11. The circuit of claim 9, wherein the time delay between the first clock signal and the delayed first clock signal is adjustable according to an adjusting signal.

12. The circuit of claim 11, wherein the mimic combinational logic module comprises:
   a delay chain, configured to provide different delay versions of the first clock signal; and
   a multiplexer, configured to select one of the delay versions of the first clock signal as the delayed first clock signal according to the adjusting signal.

13. A method for preventing a setup fail between a first latch and a second latch, comprising the steps of:
   delaying a first clock signal for the first latch to generate a delayed first clock signal, which is a delayed version of the first clock signal, wherein a time delay between the first clock signal and the delayed first clock signal is within a specific range of a time delay of a signal path between the first latch and the second latch, wherein the time delay between the first clock signal and the delayed first clock signal matches the time delay of the signal path between the first latch and the second latch through a combination logic; and
   providing a delayed second clock signal from a compare module, which is a delayed version of a second clock signal for the second latch, to the second latch after receiving both the delayed first clock signal and the second clock signal at the compare module;
   activating an error signal when the delayed first clock signal is received after the second clock signal at the compare module.

14. The method of claim 13, further comprising a step of:
   adjusting the time delay between the first clock signal and the delayed first clock signal.

15. A method for detecting a setup fail between a first latch and a second latch, comprising the steps of:

delaying a first clock signal for the first latch to generate a delayed first clock signal, which is a delayed version of the first clock signal, wherein a time delay between the first clock signal and the delayed first clock signal is within a specific range of a time delay of a signal path between the first latch and the second latch, the time delay between the first clock signal and the delayed first clock signal matches the time delay of the signal path between the first latch and the second latch;

receiving the delayed first clock signal and a second clock signal at a compare module, for the second latch; and activating an error signal when the delayed first clock signal is received after the second clock signal at the compare module.

16. The method of claim 15, further comprising a step of:

adjusting the time delay between the first clock signal and the delayed first clock signal.

17. A circuit for preventing a setup fail between a first latch and a second latch, comprising:

a mimic combinational logic module, configured to receive a first clock signal for the first latch and to generate a delayed first clock signal, which is a delayed version of the first clock signal; and a clock compare module, configured to compare the delayed first clock signal and a second clock signal so as to generate a delayed second clock signal for the second latch and an error signal when the delayed first clock signal mimics a data signal causing a setup fail of the second latch using the second clock, wherein the clock compare module comprises:

a gate logic, configured to receive the delayed first clock signal and a second clock signal and to provide the delayed second clock signal, wherein the logic level of the delayed second clock signal is high when both the logic levels of the delayed first clock signal and the second clock signal are high, and the logic level of the delayed second clock signal is low otherwise;

a combinational logic block, configured to receive the second clock signal and the delayed second clock signal and to provide a combinational data signal and a combinational clock signal; and a third latch, configured to receive the combinational data signal as its data input, receive the combinational data signal as its clock signal, and provide its data output as the error signal.

\* \* \* \* \*